United States Patent
Fossum et al.

(10) Patent No.: US 9,728,565 B2
(45) Date of Patent: Aug. 8, 2017

(54) LOW FULL-WELL CAPACITY IMAGE SENSOR WITH HIGH SENSITIVITY

(71) Applicant: TRUSTEES OF DARTMOUTH COLLEGE, Hanover, NH (US)

(72) Inventors: Eric R. Fossum, Wolfeboro, NH (US); Jiaju Ma, West Lebanon, NH (US); Donald Hondongwa, Hanover, NH (US)

(73) Assignee: TRUSTEES OF DARTMOUTH COLLEGE, Hanover, NH (US)

( * ) Notice: Subject to any disclaimer, the term of this patent is extended or adjusted under 35 U.S.C. 154(b) by 0 days.

(21) Appl. No.: 14/898,088

(22) PCT Filed: Jun. 11, 2014

(86) PCT No.: PCT/US2014/042015
§ 371 (c)(1),
(2) Date: Dec. 11, 2015

(87) PCT Pub. No.: WO2015/006008
PCT Pub. Date: Jan. 15, 2015

(65) Prior Publication Data
US 2016/0141316 A1 May 19, 2016

Related U.S. Application Data

(60) Provisional application No. 61/833,710, filed on Jun. 11, 2013, provisional application No. 61/833,701, filed on Jun. 11, 2013.

(51) Int. Cl.
*H01L 27/146* (2006.01)
*H01L 31/075* (2012.01)
*H01L 27/144* (2006.01)

(52) U.S. Cl.
CPC .... *H01L 27/14607* (2013.01); *H01L 27/1443* (2013.01); *H01L 27/1461* (2013.01);
(Continued)

(58) Field of Classification Search
CPC ............. H01L 31/00; H01L 31/0232; H01L 31/02327; H01L 31/035272; H01L 31/04;
(Continued)

(56) References Cited

U.S. PATENT DOCUMENTS 5,665,959 A 9/1997 Fossum et al.
6,297,492 B1 10/2001 Clark
(Continued)

OTHER PUBLICATIONS

"Back Illuminated Vertically Pinned Photodiode with in Depth Charge Storage," by J. Michelot, F. Roy, J. Prima, C. Augier, F. Barbier, S. Ricq, P. Boulenc, Z.Essa, L. Pinzelli, H. Leininger, M. Gatefait, J.-E. Broquin. International Image Sensor Workshop 2011, Hokkaido, Japan.
(Continued)

*Primary Examiner* — Eduardo A Rodela
(74) *Attorney, Agent, or Firm* — David V. Rossi; Haug Partners LLP

(57) ABSTRACT

Image sensor pixels having low full-well capacity and high sensitivity for applications such as DIS, qDIS, single/multi bit QIS. Some embodiments provide an image sensor pixel architecture, comprises a transfer gate, a floating diffusion region both formed on a first surface of a semiconductor substrate and a buried-well vertically pinned photodiode having a charge accumulation/storage region disposed substantially or entirely beneath the transfer gate. Image sensor may also comprise an array of pixels, wherein each pixel comprises: a vertical bipolar structure including an emitter, base, collector configured for storing photocarriers in the base; and a reset transistor coupled to the base, configured to be completely reset of all free carriers using the reset
(Continued)

transistor. The emitter may be configured as a pinning layer to facilitate full depletion of the base. Such image sensor pixels may have a full well capacity less than that giving good signal-to-noise ratio (SNR).

21 Claims, 14 Drawing Sheets

(52) U.S. Cl.
CPC ...... *H01L 27/1463* (2013.01); *H01L 27/1464* (2013.01); *H01L 27/14612* (2013.01); *H01L 27/14621* (2013.01); *H01L 27/14627* (2013.01); *H01L 27/14641* (2013.01); *H01L 27/14645* (2013.01); *H01L 27/14681* (2013.01); *H01L 31/075* (2013.01)

(58) Field of Classification Search
CPC ... H01L 31/042; H01L 31/072; H01L 31/075; H01L 31/03529; H01L 31/0352; H01L 31/035281; H01L 27/14; H01L 27/1443; H01L 27/14603; H01L 27/14605; H01L 27/14607; H01L 27/14612; H01L 27/1464; H01L 27/14643

See application file for complete search history.

(56) References Cited

U.S. PATENT DOCUMENTS

| | | | |
|---|---|---|---|
| 8,576,299 B2* | 11/2013 | Mabuchi | H01L 27/14621 348/230.1 |
| 2007/0014019 A1* | 1/2007 | Mouli | G02B 3/0018 359/619 |
| 2007/0114629 A1* | 5/2007 | Dosluoglu | H01L 27/14609 257/435 |
| 2009/0179232 A1 | 7/2009 | Adkisson et al. | |
| 2010/0327148 A1 | 12/2010 | Chung et al. | |
| 2011/0019041 A1* | 1/2011 | Ishiwata | H01L 27/14621 348/280 |
| 2011/0169055 A1* | 7/2011 | Wu | H01L 27/14616 257/228 |
| 2013/0092982 A1 | 4/2013 | Chen et al. | |
| 2013/0128077 A1 | 5/2013 | Georgiev | |

OTHER PUBLICATIONS

International Search Report and Written Opinion mailed Oct. 22, 2014 in corresponding International Application No. PCT/US2014/042015 (11 pages).

* cited by examiner

LOW FULL-WELL CAPACITY IMAGE SENSOR WITH HIGH SENSITIVITY

RELATED APPLICATIONS

This application claims the benefit of U.S. Provisional Application Nos. 61/833,701 and 61/833,710, each filed Jun. 11, 2013, each of which is incorporated herein by reference in its entirety for purposes of each PCT member state and region in which such incorporation by reference is permitted or otherwise not prohibited.

BACKGROUND

The present disclosure relates generally to image sensors and, more particularly, some embodiments of the present invention relate to pixel architectures that are well-suited for implementing subdiffraction-limit (SDL) pixels, single-bit photoelectron counting pixels that may be used in a Quanta Image Sensor (QIS), and multi-bit photoelectron counting pixels that may be used in a quantized Digital Integration Sensor (qDIS).

In a conventional CMOS active pixel sensor with intra-pixel charge transfer, the photodetecting element is typically a pinned photodiode (PPD), and the signal charge integrated in the PPD is completely transferred to a floating diffusion (FD) node by pulsing a transfer gate (TG). The FD potential must be reset (typically by a reset transistor, just prior to transfer) to a voltage (reset voltage) that is sufficiently high such that when TG is turned on, signal charge passively and completely flows from the PPD, under the TG, and into the FD. At lower FD reset voltages, the signal charge may not transfer completely because the FD becomes "filled" with signal charge before all of the signal charge is transferred. Thus, careful circuit design is required to ensure sufficiently high voltage reset of the FD, sometimes requiring the use of overvoltages or bootstrapping. Increasing the full well of the sensor exacerbates these problems, as both the depth of the PPD well is increased, and the capacity of FD must also be increased by increasing the FD capacitance and/or reset voltage.

In the case of novel image sensor concepts such as the Digital Integration Sensor (DIS), quantized Digital Integration Sensor (qDIS), or the quanta image sensor (QIS) where full well capacity is intentionally reduced, some of the complexity of pixel design is transferred to high speed readout design. While the lower full-well requirement may provide some additional flexibility in considering ways of further shrinking the pixel to achieve higher density, providing pixels for such novel image sensors nonetheless presents many unique and new challenges as well as opportunities for technical developments to provide for high quality and performance; in other words, many technical issues and problems arise that are simply not present, or not an issue, in current state-of-the art image sensors.

For example, image sensors such as QIS, qDIS, and DIS require pixels that are highly sensitive to photoelectrons. In some implementations (e.g., QIS), photoconversion of only one or several photons must generate a voltage change that is large enough to be detected, meaning that the charge-to-voltage conversion gain may need to be more than 0.5 mV/e–, possibly as much as or more than 1 mV/e–. And, generally, simply scaling a conventional CMOS image sensor pixel will not necessarily provide the sensitivity required for implementing QIS, qDIS, and DIS image sensors.

SUMMARY OF SOME EMBODIMENTS

Some embodiments of the present invention provide an image sensor pixel that is compact and has low full-well capacity and high sensitivity (e.g., high conversion gain), thus being well-suited for applications such as DIS, qDIS, single bit QIS, and multi-bit QIS image sensors. See, e.g., E. R. Fossum, *Modeling the Performance of Single-Bit and Multi-Bit Quanta Image Sensors*, IEEE J. Electron Devices Society, vol. 1(9), pp. 166-174, September 2013, which is hereby incorporated by reference in its entirety.

Some embodiments provide an image sensor pixel architecture, or an image sensor having a pixel architecture, that comprises a transfer gate formed on a first surface of a semiconductor substrate, a floating diffusion region formed in the first surface of the semiconductor substrate, and a buried-well vertically pinned photodiode having a charge accumulation/storage region disposed substantially or entirely beneath the transfer gate, and wherein a potential barrier to charge transfer exists between the charge accumulation/storage region and the floating diffusion when a first voltage is applied to the transfer gate (e.g., corresponding to an "integration mode") and no potential barrier exists between the charge accumulation/storage region and the floating diffusion when a second voltage is applied to transfer gate (e.g., corresponding to a "transfer mode") such that the transfer gate is operable to selectively transfer charge from the charge accumulation/storage region to the floating diffusion, and wherein the charge accumulation/storage region has a full-well capacity less than that considered to give good SNR or dynamic range for a single readout of the pixel.

For example, in various illustrative embodiments, the full-well capacity of the charge accumulation/storage region is less than 3000 charge carriers (e.g., electrons and holes for an n-type and a p-type charge accumulation/storage region, respectively). And, in various embodiments, the full-well capacity of the charge accumulation/storage regions is not more than $2^m$ charge carriers, for a given integer value of m from 0 through 10, inclusive (i.e., $0 \leq m \leq 10$, where m is an integer).

In accordance with some embodiments, an image sensor comprising an array of pixels, wherein each pixel comprises: a vertical bipolar structure comprising an emitter, a base, and a collector, and wherein the vertical bipolar structure is configured for storing photocarriers in the base region; and a reset transistor coupled to the base, and wherein the base of the bipolar structure is configured to be completely reset of all free carriers using the reset transistor. The reset transistor may be disposed laterally adjacent to the base. The image sensor may have a full well capacity less than that considered to give good signal-to-noise ratio (SNR) or dynamic range for a single readout of the pixel. In addition, the image sensor may comprise an emitter configured as a pinning layer to facilitate full depletion of the base.

While pixels according to some embodiments of the present invention are well-suited for use in image sensors demanding very high conversion gain (e.g., QIS, qDIS, or other single-bit or multi-bit photoelectron counting sensors), it will be understood in view of the ensuing disclosure that some embodiments of the present invention may also be applicable to conventional CMOS image sensors (e.g., present-day, commercially available CMOS image sensors for consumer, manufacturing, and/or scientific applications).

Throughout the description and claims, the following terms take at least the meanings explicitly associated herein, unless the context dictates otherwise. The meanings identified below do not necessarily limit the terms, but merely provide illustrative examples for the terms. The phrase "an embodiment" as used herein does not necessarily refer to the same embodiment, though it may. In addition, the meaning of "a," "an," and "the" include plural references; thus, for example, "an embodiment" is not limited to a single embodiment but refers to one or more embodiments. Similarly, the phrase "one embodiment" does not necessarily refer the same embodiment and is not limited to a single embodiment. As used herein, the term "or" is an inclusive "or" operator, and is equivalent to the term "and/or," unless the context clearly dictates otherwise. The term "based on" is not exclusive and allows for being based on additional factors not described, unless the context clearly dictates otherwise.

Also, as used herein, "n" and "p" designations (e.g., as in "n-type," "p-type," "n-well," etc.) are used in ordinary and customary manner to designate donor and acceptor type impurities that promote electron and hole carriers, respectively, as majority carriers. The term "substrate" is to be understood as a semiconductor-based material such as silicon, silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "substrates" in the following description, previous process steps may have been utilized to form regions or junctions in the base semiconductor structure or foundation. In addition, the semiconductor need not be silicon-based, but may be based on, for example, silicon-germanium, germanium, or gallium arsenide.

In addition, as used herein, unless the context clearly dictates otherwise, the term "coupled" refers to directly connected or to indirectly connected through one or more intermediate components and, in some contexts, may also denote or include electrically coupled, such as conductively coupled, capacitively coupled, and/or inductively coupled. Further, "conductively coupled" refers to being coupled via one or more intermediate components that permit energy transfer via conduction current, which is capable of including direct current as well as alternating current, while "capacitively coupled" refers to being electrostatically coupled through one or more dielectric media, and possibly also via one or more intervening conductors (e.g., via a series of capacitive components), that permit energy transfer via displacement current and not via direct current. Those skilled in the art will further understand that elements may be capacitively coupled intentionally or unintentionally (e.g., parasitically) and that in some contexts, elements said to be capacitively coupled may refer to intentional capacitive coupling. In addition, those skilled in the art will also understand that in some contexts the term "coupled" may refer to operative coupling, through direct and/or indirect connection. For instance, a conductor (e.g., control line) said to be coupled to the gate of a transistor may refer to the conductor being operable to control the gate potential so as to control the operation of the transistor (e.g., switching the transistor between "on" and "off" states), regardless of whether the conductor is connected to the gate indirectly (e.g., via another transistor, etc.) and/or directly.

In addition, as used herein, unless the context clearly dictates otherwise, the term "low full-well capacity" with respect to a pixel refers to a charge capacity less than that considered by those skilled in the art as giving good signal-to-noise ratio (SNR) or dynamic range for a single readout of the pixel. For example, typical conventional pixel designs strive for full well capacity of 3000 or more carriers. As such, in various contexts, low full-well capacity may be considered as being less than 3000 carriers. And, in various embodiments or contexts, low full-well capacity may more specifically refer to not more than about 2048 carriers, or not more than $2^m$ charge carriers, for a given integer value of m from 0 through 10, inclusive (i.e., $0 \leq m \leq 10$, where m is an integer).

It will be appreciated by those skilled in the art that the foregoing brief description and the following description with respect to the drawings are illustrative and explanatory of some embodiments of the present invention, and are neither representative nor inclusive of all subject matter and embodiments within the scope of the present invention, nor intended to be restrictive or characterizing of the present invention or limiting of the advantages which can be achieved by embodiments of the present invention, nor intended to require that the present invention necessarily provide one or more of the advantages described herein with respect to some embodiments. Thus, the accompanying drawings, referred to herein and constituting a part hereof, illustrate some embodiments of the invention, and, together with the detailed description, serve to explain principles of some embodiments of the invention.

BRIEF DESCRIPTION OF THE DRAWINGS

Aspects, features, and advantages of some embodiments of the invention, both as to structure and operation, will be understood and will become more readily apparent in view of the following description of non-limiting and non-exclusive embodiments in conjunction with the accompanying drawings, in which like reference numerals designate the same or similar parts throughout the various figures, and wherein.

DETAILED DESCRIPTION OF SOME EMBODIMENTS

Figure 1:
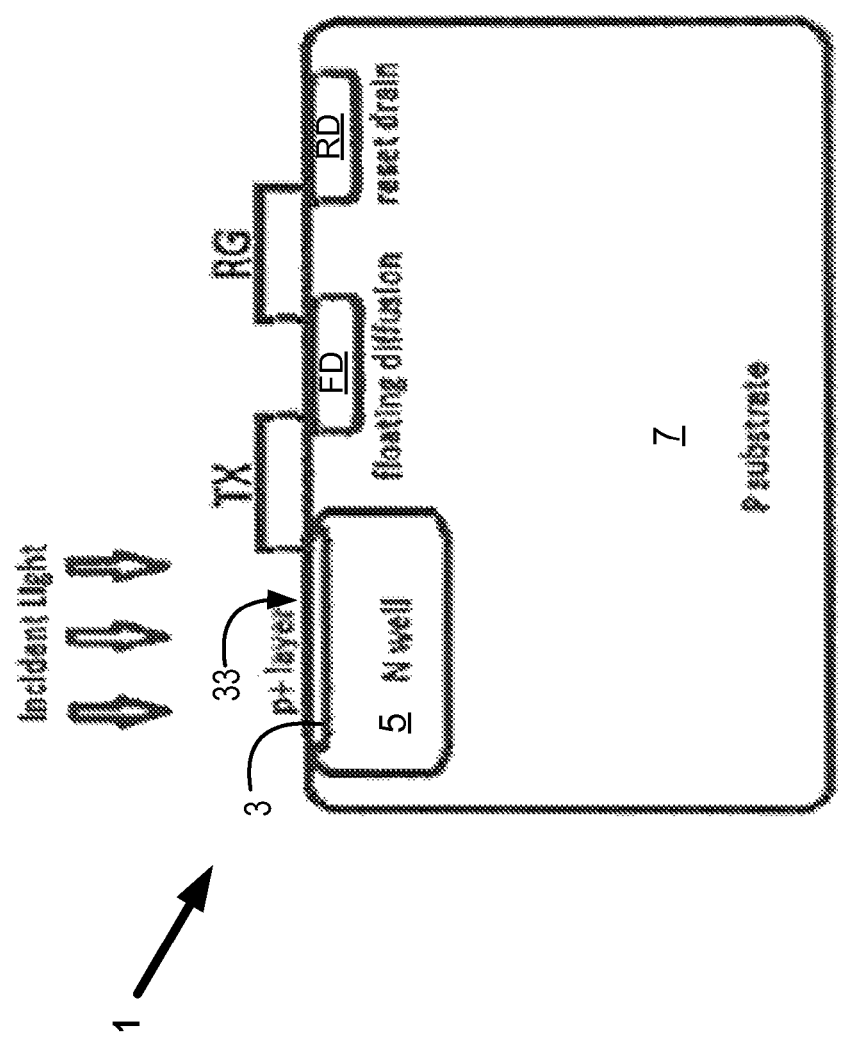
FIG. 1 schematically depicts an illustrative cross-sectional view of a prior art CMOS image sensor pixel.

Briefly, as will be understood from the ensuing disclosure, illustrative embodiments of the present invention provide an image sensor pixel that is compact and has low full-well capacity and high sensitivity (e.g., high conversion gain). Some such embodiments as disclosed below are directed to a CMOS active pixel sensor (APS) structure configured to store photocarriers (also referred to herein as photocharge; e.g., photoelectrons or photoholes) in a low full-well capacity storage well buried beneath the transfer gate. And some such embodiments as disclosed below are directed to a bipolar junction transistor pixel structure with the base fully depleted and used to store the photocarriers (e.g., photoelectrons or photoholes). In view of the ensuing disclosure, it will be appreciated that a feature of the illustrative embodiments disclosed herein is that the pixel configurations are congruent with current CMOS imager technologies; that is, even the bipolar transistor pixel (e.g., jot) structure may be implemented according to CMOS imager fabrication technology and, therefore, for example, readout circuitry, etc., may employ MOS transistor technology. It will be understood, however, that this feature of being congruent with current CMOS imager technologies is not an essential feature required by the claimed subject matter.

More specifically, compared to a conventional pinned photodiode CMOS imager pixel architecture, in which the pinning dopant layer is disposed at the upper surface of the substrate adjacent to the transfer gate, a pixel according to some embodiments of the present invention employs a buried photodiode well disposed underneath the transfer gate, and the device is preferably configured for backside illumination (e.g., so that no photons are lost trying to penetrate the transfer gate). This stacked configuration contributes to the whole pixel device being more compact from a plan view perspective, and the low full-well capacity provides for further scaling the device for implementing QIS, qDIS, and/or DIS image sensors.

A pixel architecture having a transfer gate stacked above a high full-well capacity photodiode is, for example, disclosed in "Back Illuminated Vertically Pinned Photodiode with in Depth Charge Storage," by J. Michelot, F. Roy, J. Plima, C. Augier, F. Barbier, S. Ricq, P. Boulenc, Z.Essa, L. Pinzelli, H. Leininger, M. Gatefait, J.-8. Broquin in Proc. International Image Sensor Workshop, Hokkaido Japan, Jun. 8-11 , 2011. The article concludes, "We have realized a vertically pinned photodiode with a 1.4 µm pitch. Thanks to diode architecture with TG stacked above the vertically pinned photodiode and due to an optimized doping profile, we achieved a high full-well capacity of 11000 electrons and a low charge lag." A high full-well capacity, however, may be problematic, as disclosed in the article: "The photodiode deliberately shows a pear shape with an extended region near the backside. Due to that shape, charges generated near the back surface cannot diffuse toward the drain of the MOS pixels sharing the same well as the photodiode. This specific lateral spreading must be carefully implemented since it can be source of charge lag if too heavily doped."

The present inventors recognized that eliminating the requirement for high full-well capacity in a pixel structure having the transfer gate stacked above the charge storage/accumulation region not only allows for avoiding lateral spreading and charge lag limitations, but also allows for scaling the pixel to smaller technology nodes in a manner that provides a highly compact pixel having the sensitivity required for implementing QIS, qDIS, and/or DIS image sensors. Accordingly, some embodiments of the present invention, discussed below, provide a novel image sensor pixel (and image sensor using such pixels) having a low full-well capacity charge storage/accumulation region disposed beneath a transfer gate that is operable to selectively control charge transfer from the low full-well capacity charge storage/accumulation region to a high conversion gain floating diffusion node.

As will be understood by those skilled in the art in view of the present disclosure, while some embodiments of the present invention are well-suited for implementing novel image sensor concepts such as DIS and QIS, various embodiments also have myriad applications in more conventional high sensitivity (e.g., low light) image sensors.

Referring now to FIG. 1, a schematic cross-sectional illustration of a conventional CMOS image sensor pixel 1 is depicted to aid, by way of comparison or reference, in the understanding of various aspects of some embodiments of the present invention. For clarity of exposition, not all features of the prior art pixel are shown. Also, while FIG. 1 depicts a front-side illuminated CMOS APS pixel, backside illuminated pixels are also well known in the art. The pixel 1 comprises a p+ pinning layer 3 with an n-well photocarrier storage well 5 underneath, formed in a p-type substrate 7. The storage well 5 is full depleted when empty (i.e., when it does not contain photocarriers). There is a transfer gate TX as part of an MOS transistor. Adjacent to TX is a floating diffusion region (FD). The FD is reset to a potential using the reset gate transistor comprising reset gate RG and reset drain RD. Typically, the reset voltage (not shown) is applied to the reset drain RD. When RG is pulsed, FD is reset to approximately the reset voltage. The voltage on FD is sensed by a readout circuit (not shown) coupled to FD. The transfer gate TX is then pulsed to transfer signal carriers integrated in the storage well to FD. If designed properly, all carriers integrated in the photocarrier storage well 5 are completely transferred to FD. The new voltage on FD is then sensed and the difference between the reset level of FD and this second level is proportional to the number of transferred signal carriers. The proportionality constant is the conversion gain (Volts per electron), which is the inverse of the capacitance of the FD node. A typical value of the FD conversion gain is 50 µV/e− and a typical value of the maximum signal that can be transferred with good linearity is 3000-5000 e−, depending on pixel size. This is called the full-well and is limited by the lesser of the storage capacity of the n-well region and the maximum voltage swing allowed on the FD node divided by the conversion gain. At 50 µV/e−, 5000 electrons produce a 0.25V swing, for example. Larger pixels can have even larger full well capacities.

In this simplified pixel illustration of FIG. 1, the plan view (not shown) of the pixel will show a pinned photodiode area, a TX area, an FD area, an RG area and an RD area. Additional components of the pixel are well known in the state of the art and also occupy part of the area in a plan view of the pixel.

Figure 2:
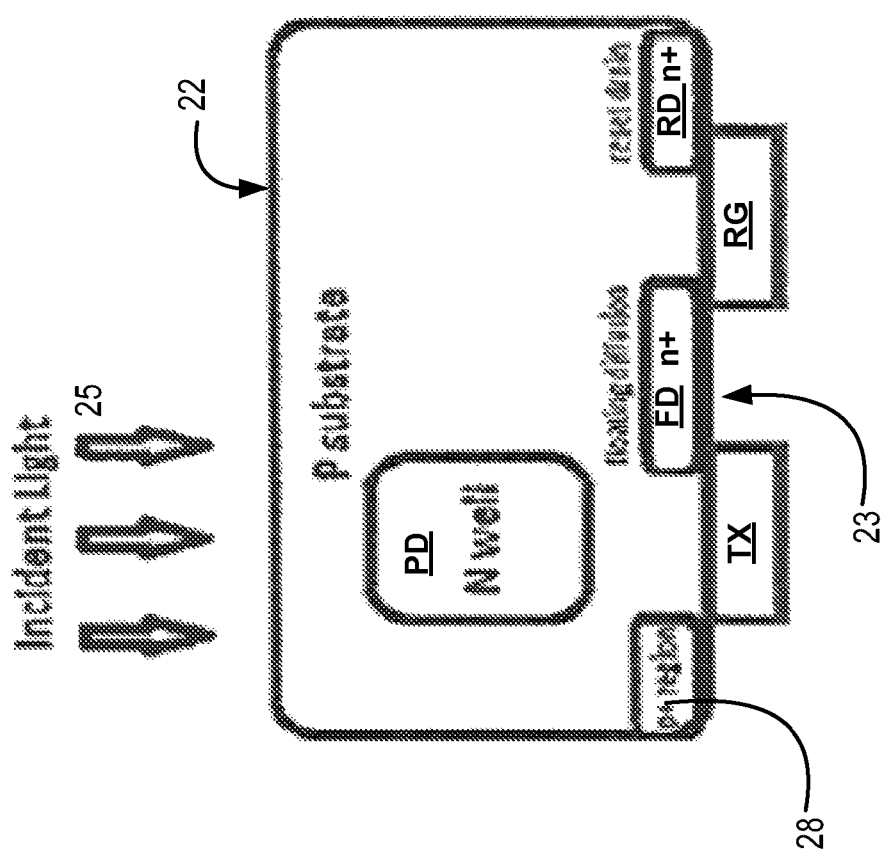
FIGS. 2 schematically depicts an illustrative cross-sectional view of a portion of a pixel of a CMOS image sensor, in accordance with some embodiments of the present invention.

FIG. 2 schematically depicts an illustrative cross-sectional view of a portion of a pixel of a CMOS image sensor, in accordance with some embodiments of the present invention. More specifically, for clarity of exposition, FIG. 2 does not show the entire architecture of a whole pixel, but focuses primarily on the charge collection and transfer portions of the illustrative pixel embodiment. As further described below, a pixel may include additional circuitry, such as transistors and interconnect structures, and an image sensor may comprise an array of such pixels (e.g., pixels arranged in rows and columns).

As shown in FIG. 2, the illustrative pixel may be fabricated on a p-type substrate having a top/frontside surface 23 opposite a backside surface 22, and the pixel may be configured for backside illumination by incident light 25 (e.g., so that no photons are lost trying to penetrate the transfer gate). In this embodiment, the pixel comprises a buried photocharge accumulation region implemented as n-well region PD, which forms a photodiode with surrounding p-type regions (which, in some embodiments, may comprise p+ pinning region(s) abutting n-well region PD). As shown, the n-well storage region PD is disposed beneath a charge transfer gate stack (comprising transfer gate TX and gate dielectric (not shown)) that is formed on top surface 23 and overlaps a charge collection region implemented as an n+ floating diffusion FD formed in top surface 23, and that is operable to selectively transfer charge from the photocharge accumulation region (n-well region PD) to the charge collection region (floating diffusion FD). In some embodiments, such as the present illustrative embodiment, the transfer of charge from the storage well PD is primarily vertically to under the transfer gate TG, and then laterally to the floating diffusion FD. Prior to transferring charge accumulated in storage well PD to FD, the reset gate RG may be pulsed to reset FD to approximately a voltage level applied to the reset drain RD.

As also shown in FIG. 2, some embodiments may include an optional layer of p+ region 28 adjacent to the TX gate. When the TX gate is turned off, if biased properly, the p+ region 28 can supply holes to the surface under TX and thereby suppress dark current generation by traps. The p+ layer 28, however, is not required for embodiments of the present invention to operate—in some implementations it may be desired for enhancing dark current performance. Generally, a potential barrier exists between storage well PD and the surface under the TX gate, and this barrier prevents dark current from flowing from under the gate to the storage well and it instead flows to FD. In addition, the storage well and surrounding subsurface region may also be designed (e.g., based on doping profiles) to collect and funnel as many photocarriers as possible to the storage well rather than having those carriers be lost to the floating diffusion or reset transistor portion of the pixel.

In view of the illustrative embodiments, it will be understood that by having the photocarrier storage well located under the TX gate, the pixel can be made smaller in chip area (e.g., compared to the conventional pixel of FIG. 1) for the same size of other pixel components such as FD, TX, TG, etc., and the need for a pinning diode cap layer is eliminated.

If high storage capacity of the storage well were required as is the case in conventional image sensors, such a device would be difficult to implement (if not impractical, depending on design requirements) because, for example, the voltages required to cause complete depletion of the storage area may exceed those allowed by conventional semiconductor processes with small feature sizes such as 65 nm and less. Without complete transfer of free carriers from the storage region (e.g., due to the inability to provide sufficient voltages), lag and noise may be introduced to the image sensor operation.

A TCAD simulation was performed for a model of a device structure comprising a buried-well photodiode disposed beneath a transfer gate in accordance with some embodiments of the present disclosure. In order to permit complete charge transfer, doping profiles must be chosen to enable a monotonically increasing potential to exist along a path between the storage well and the FD. This illustrated in FIG. 4 and in FIG. 5.

Figure 3:
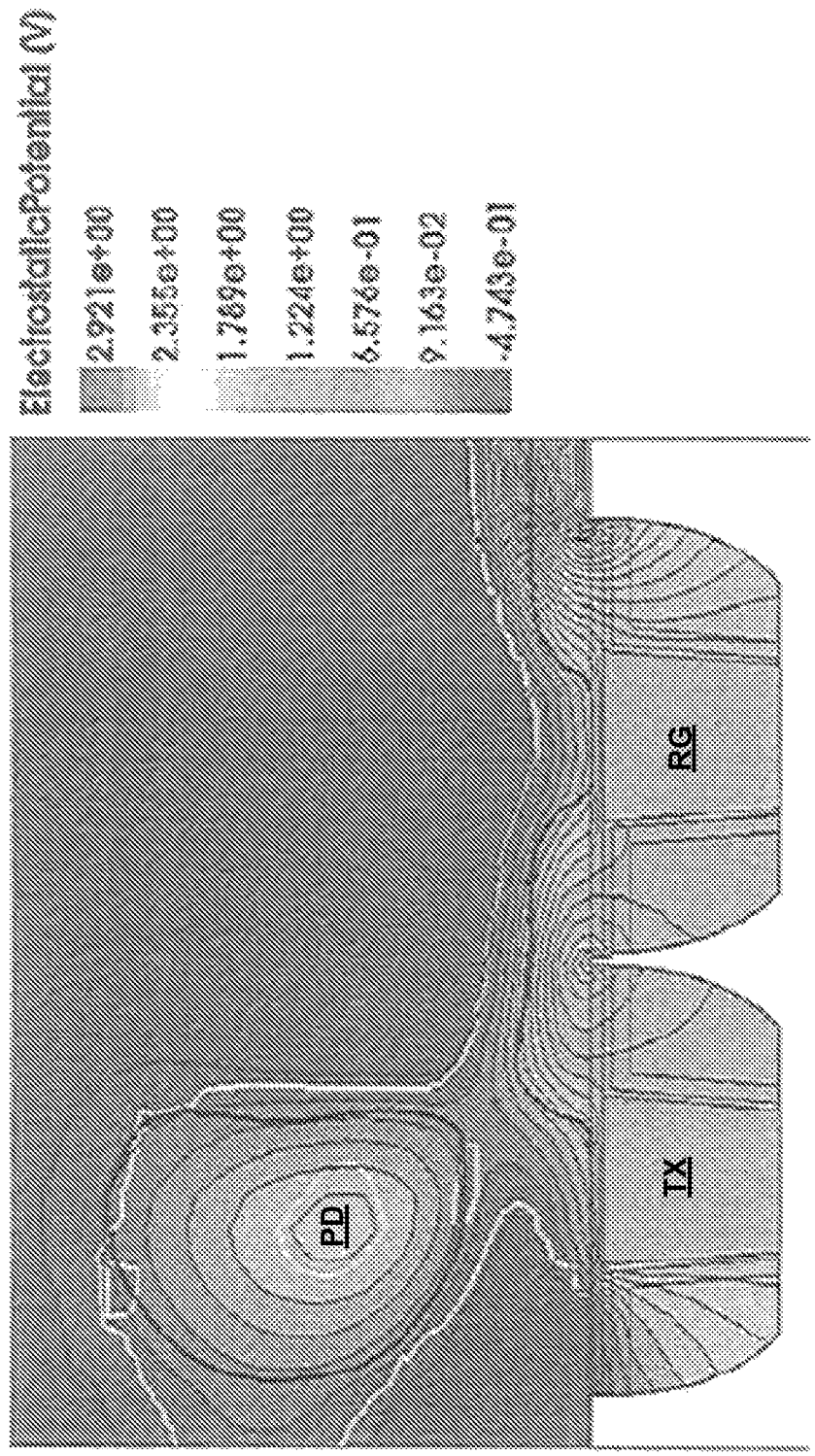
FIG. 3 depicts the simulated electrostatic potential under the conditions of the transfer gate TX in the off state and no stored charge in the buried photodiode PD storage region, in accordance with an illustrative example according to some embodiments.
Figure 4:
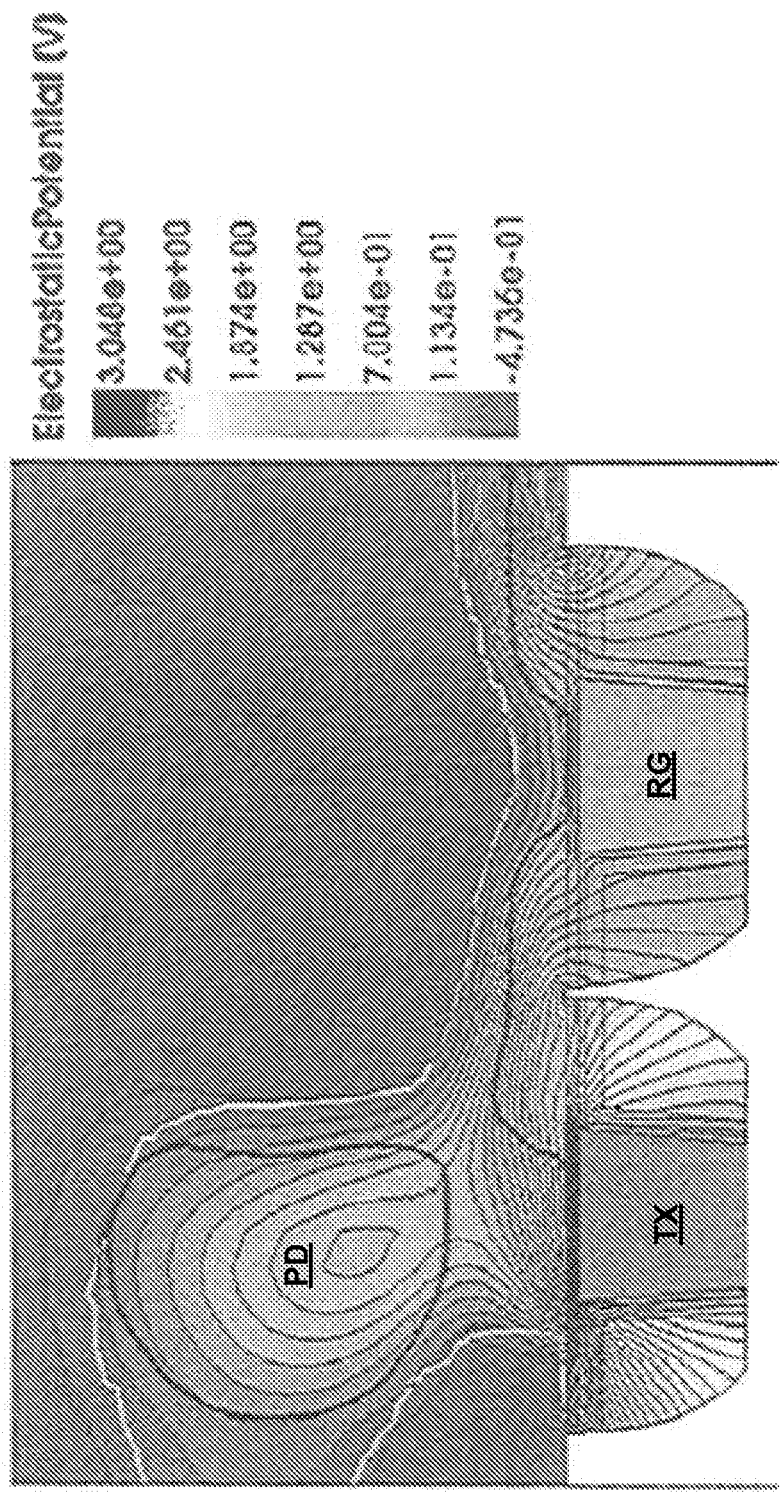
FIG. 4 depicts the simulated electrostatic potential under the conditions of the transfer gate TX in the on state and no stored charge in the buried photodiode PD storage region, in accordance with an illustrative example some embodiment.
Figure 5:
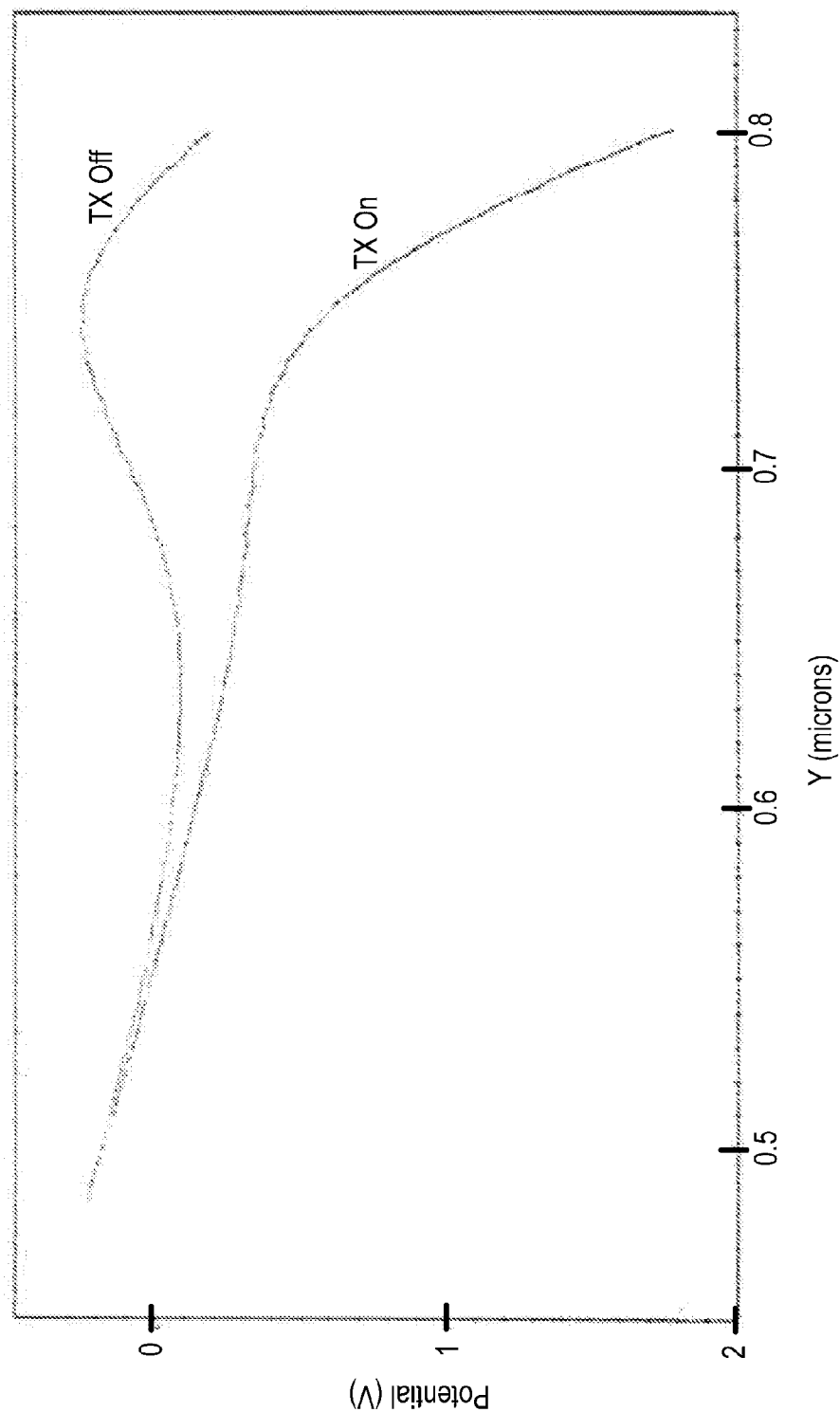
FIG. 5 shows the simulated potential when TX is off, in accordance with an illustrative example according to some embodiments.

More specifically, FIG. 3 depicts the electrostatic potential under the conditions of the transfer gate TX in the off state and no stored charge in the buried photodiode PD storage region, and demonstrates a potential barrier separating the photodiode storage well region from the floating diffusion region FD and the transfer gate. FIG. 4 depicts the electrostatic potential under the conditions of the transfer gate TX in the on state and no stored charge in the buried photodiode PD storage region, and demonstrates that the potential increases monotonically along a path from the photodiode PD storage region toward the surface region beneath the transfer gate TG and toward the floating diffusion FD. And FIG. 5 depicts the potential profiles corresponding to FIGS. 3 and 4, but along a path in the Y-direction; namely, from the storage region toward the surface under the transfer gate TG.

Figure 6:
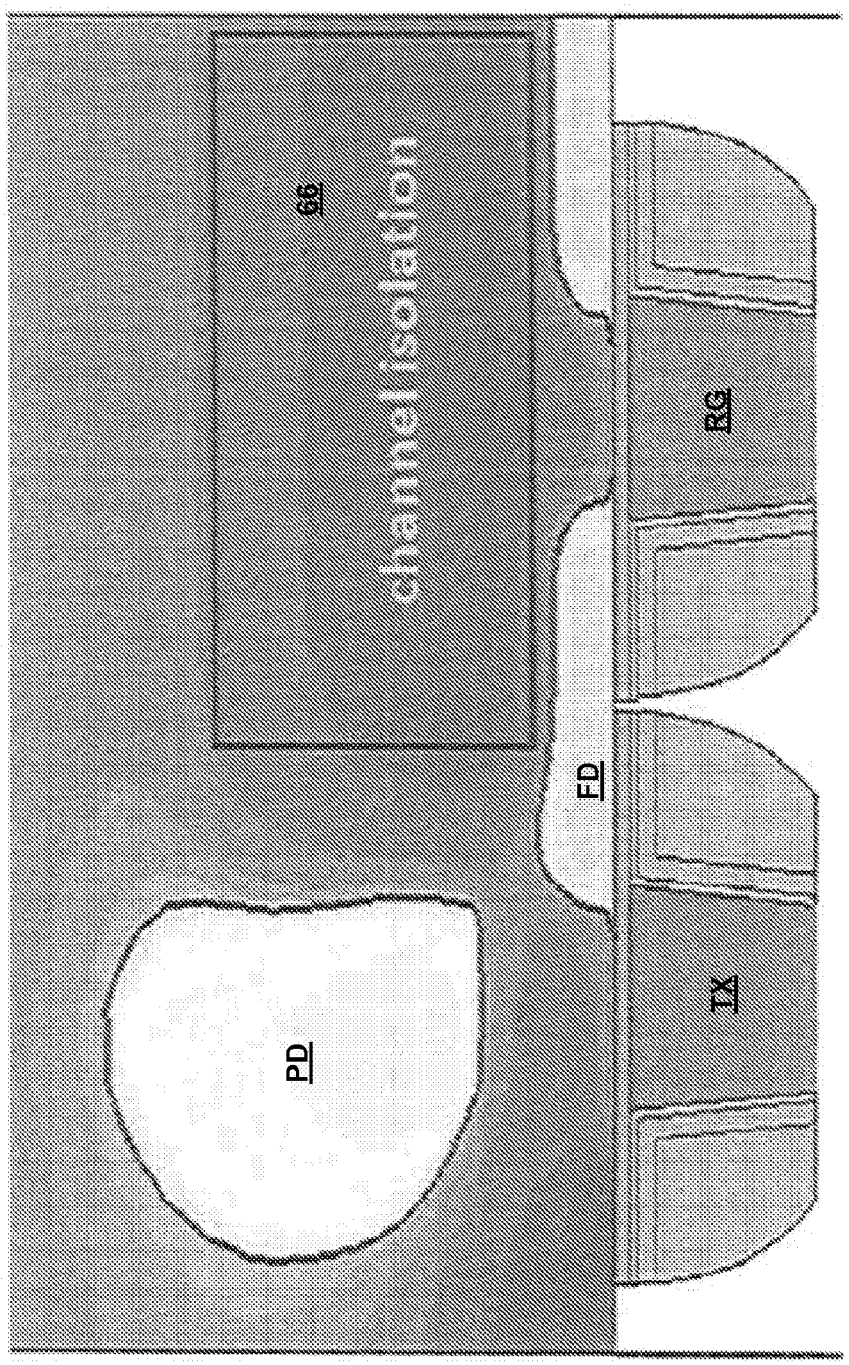
FIG. 6 depicts the doping profile of a simulated device, in accordance with an illustrative example according to some embodiments.

In the illustrative TCAD model, which is not limiting of the present invention, an 85 nm process was used. The TX gate length is approximately 300 nm and the deepest part of the storage well is located approximately 300 nm below TX. More aggressive designs and the use of more advanced technology nodes are both possible for shrinking the pixel to a 700 nm pitch and smaller. Small pitch is used to increase the effective storage capacity of the QIS or quantized DIS (qDIS) sensors in bits per $um^2$ and does not contribute to significantly improved optical resolution at these dimensions due to the physical diffraction limit. The subsurface region under the reset gate RG is doped more p-type than the deeper regions so as to create a barrier for photoelectrons absorbed below RG from coming to the surface. Instead, they diffuse/drift laterally to the storage well. This is illustrated in FIG. 6, which depicts the device doping profile, and particularly depicts the channel isolation region 66 comprising the more heavily doped p-type region.

For QIS and DIS applications, it is desired that the floating diffusion node FD have very small capacitance, so effort is required to reduce the PN junction capacitance of the floating diffusion node FD. Thus, the channel isolation 66 shown in FIG. 6 should be designed to be more lightly doped in the vicinity of the PN junction formed with the floating diffusion node FD.

As will be understood by those skilled in the art, in some embodiments, the novel CMOS pixel according to the present disclosure may be combined with known prior art for readout electronics (e.g., row select transistor, source follower gate, etc.) to allow, for example, for 1.5 or 1.75 effective transistors per pixel (or other combinations) using readout sharing techniques. In addition, various isolation techniques may be employed. For example, with reference to the illustrative cross section of FIG. 1, a pixel isolation trench could be located just to the left of TX along with a deeper p+ region encasing the trench.

The pixel structure can be combined with microlenses, optical coatings, and color filters to improve optical response and color separation, as is well known to those skilled in the at 1 of backside illuminated image sensors.

An exemplary description of a CMOS image sensor technology jot implementation is included in the June 2013 paper presented at the 2013 International Image Sensor Workshop (IISW), Snowbird, Utah, entitled "Early Research Progress on Quanta Image Sensors," by Saleh Masoodian, Yue Song, Donald Hondongwa. Jiaju Ma, Kofi Odame and Eric R. Fossum, the disclosure of which is incorporated by reference herein and is considered to be part of the present disclosure. A description of an exemplary DIS imaging device, including dynamic range extension, is described in the June 2013 IISW paper, entitled "Digital Integration Sensor," by Song Chen, Andrew Ceballos, and Eric R. Fossum, the disclosure of which is incorporated by reference herein and is considered to be part of the present disclosure. The paper further describes qDIS, as well as the continuum between the conventional CMOS APS, the DIS, the qDIS and the QIS, along with trades in power and performance enhancement. The Poisson statistics of photon arrival rates are applied to the imaging performance of an exemplary QIS device, and signal and noise as a function of exposure are described in the June 2013 IISW paper, entitled "Application of Photon Statistics to the Quanta Image Sensor," by Eric R. Fossum, the disclosure of which is incorporated by reference herein and is considered to be part of the present disclosure.

Figure 7:
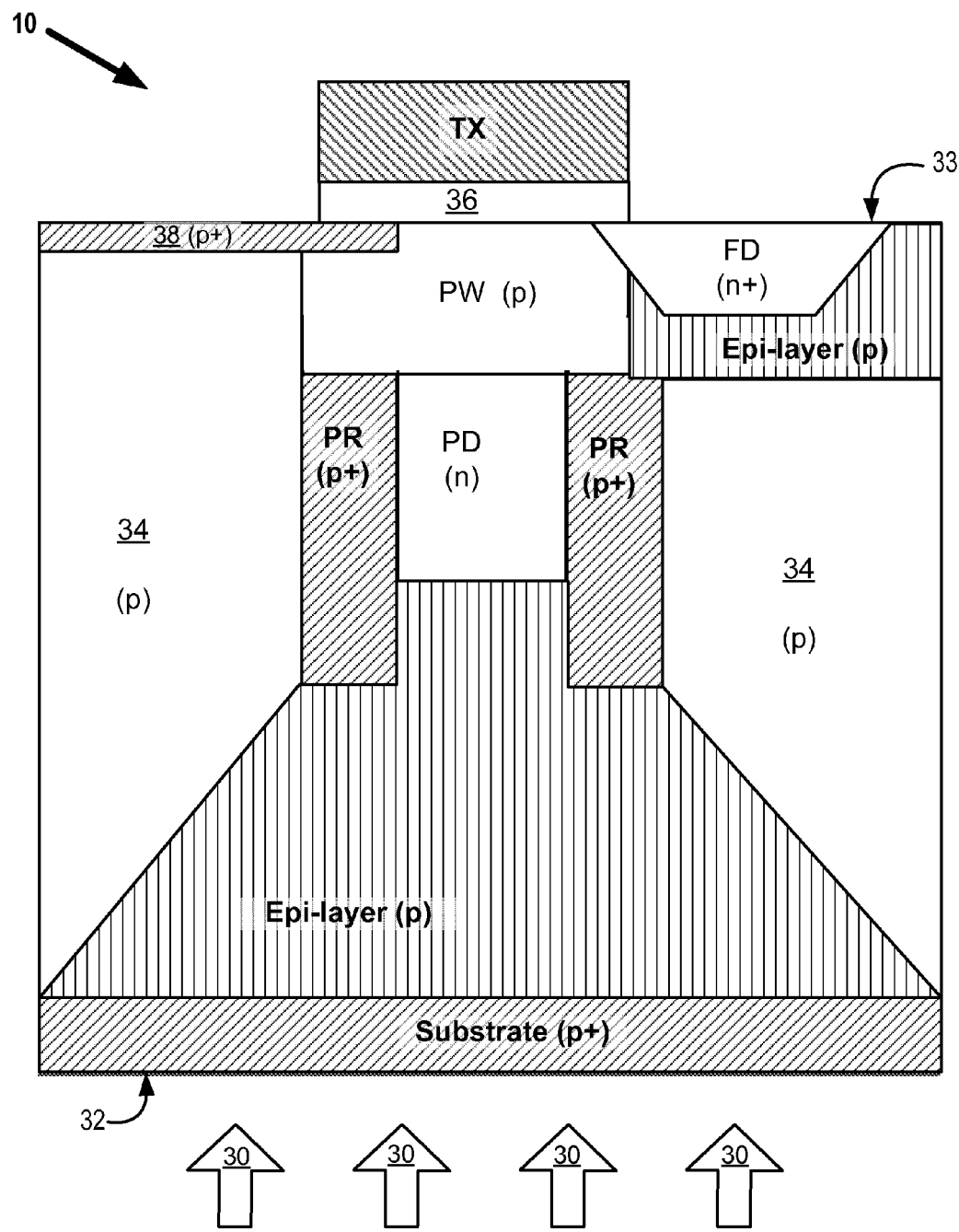
FIG. 7 schematically depicts an illustrative cross-sectional view of a portion of a pixel of a CMOS image sensor, in accordance with some embodiments of the present invention.

FIG. 7 schematically depicts an illustrative cross-sectional view of a portion 10 of a pixel of a CMOS image sensor, in accordance with some embodiments of the present invention. More specifically, FIG. 7 is presented simply for purposes of illustration of some illustrative variations that are possible, at least insofar as while being structurally and functionally similar to the illustrative embodiment of FIG. 1, it has a somewhat different layer design. FIG. 7 does not show the entire architecture of a whole pixel, but focuses primarily on the charge collection and transfer portions of the illustrative pixel embodiment. As further described below, a pixel may include additional circuitry, such as transistors and interconnect structures, and an image sensor may comprise an array of such pixels (e.g., pixels arranged in rows and columns).

As shown in FIG. 7, the illustrative pixel may be fabricated on a substrate such as a p+ substrate having a p-type epitaxial layer that has a top surface 33 opposite a backside surface 32, and the pixel may be configured for backside illumination by incident light 30. In this embodiment, the pixel comprises a buried photocharge accumulation region (implemented as n-well region PD, which forms a photodiode with p+ pinning region(s) PR) disposed beneath a charge transfer gate stack (comprising transfer gate TX and gate dielectric 36) that is (i) formed on top surface 33, (ii) overlapped with a charge collection region implemented as an n+floating diffusion FD formed in top surface 33, and (iii) operable to selectively transfer charge from the photocharge accumulation region (n-well region PD) to the charge collection region (floating diffusion FD). As indicated, additional image sensing circuitry such as transistors and interconnect structures (not shown) may be formed on the front side 33 of the substrate.

In the illustrative pixel, regions 34 have a p-type doping concentration that is greater than that of the lower epi-layer, and are configured relative to the lower epi-layer so as to increase the sensitivity of the pixel.

In some embodiments, a p+ layer 38 may be disposed to extend under a portion of the transfer gate TX, at the interface between the gate dielectric and the p-type semiconductor, so as to suppress dark current generation current due to electrons captured and later emitted by interface traps.

In the depicted pixel embodiment, the photodiode n-well PD is entirely underneath the transfer gate (TX). In various embodiments, however, the lateral extent of n-well region PD may extend beyond the lateral extent of the transfer gate TX, provided that transfer gate TX is operable to fully transfer that maximum amount of charge that would be accumulated in the n-well region under normal operating conditions for which the device is designed for use. Typically, however, confining at least the n-well region to being entirely beneath the transfer gate TX is consistent with providing compact pixels (e.g., jots for QIS applications).

More specifically, this illustrative embodiment includes a buried photodiode comprising the n-well region PD buried vertically under the transfer gate and a heavily-doped p-type pinning region PR, which in some embodiments comprise two vertically planar regions that laterally sandwich n well region PD along one lateral direction (e.g., along the direction corresponding to the direction between TX and FD), while in some embodiments pinning region PR may laterally surround n-well region PD (e.g., two pairs of planar regions in orthogonal directions). The heavily doped p-type pinning regions PR set ("pin") the fully depleted potential of the buried photodiode; namely, the maximum potential of the n-well region PD in which photoelectrons are collected and stored.

By way of non-limiting example, the p-type epi layer forming a p-n junction with n+ region FD may be doped at $10^{15} cm^{-3}$, and the p-type regions 34 may be doped at $10^{16} cm^{-3}$. Further, as will be understood by those skilled in the art, in various embodiments, the doping concentration of one or more layers may vary throughout the layer to provide various features (e.g., doping of one or more layers may be graded to introduce a field assisting carrier flow).

As indicated, it will be understood in view of the foregoing that some embodiments of the disclosed pixel are well-suited for shared pixels, namely, in shared pixel architectures that share at least the floating diffusion (e.g., and which, for example, may also share the source-follower, etc.). (As known to those skilled in the art, such shared architectures may be used for in-pixel charge-domain binning.)

By way of example, in some embodiments a four-way shared pixel structure/unit can be used (e.g., possibly comprising 7 transistors per shared pixel unit), which will further shrink the size of each pixel (e.g., each jot of a QIS). And in some such shared-pixel embodiments, the four jots sharing a common FD can be covered by a single color filter and micro lens, which will mitigate the effects of cross-talk between jots. Further, in some such embodiments, each shared-pixel unit comprising four jots (e.g., and having a single color filter and microlens) can be isolated by a single Deep Trench Isolation (DTI) around the set of four jots. That is, four jots sharing a FD are not isolated from each other by DTI, but rather are collectively isolated by DTI from other shared pixel units (i.e., other units of four jots sharing an FD). Such DTI will further reduce cross-talk between shared pixel units associated with respective color filters. It will be understood that other configurations of shared pixel units (e.g., different numbers of jots sharing a common FD) may be implemented accordingly.

Those skilled in the art will also understand in view of the foregoing that, in some embodiments, to realize extremely high conversion gain, the p-well located under floating diffusion FD should be very lightly doped. On the other hand, this doping should be high enough to prevent the depletion region of FD from extending to PD.

Figure 8:
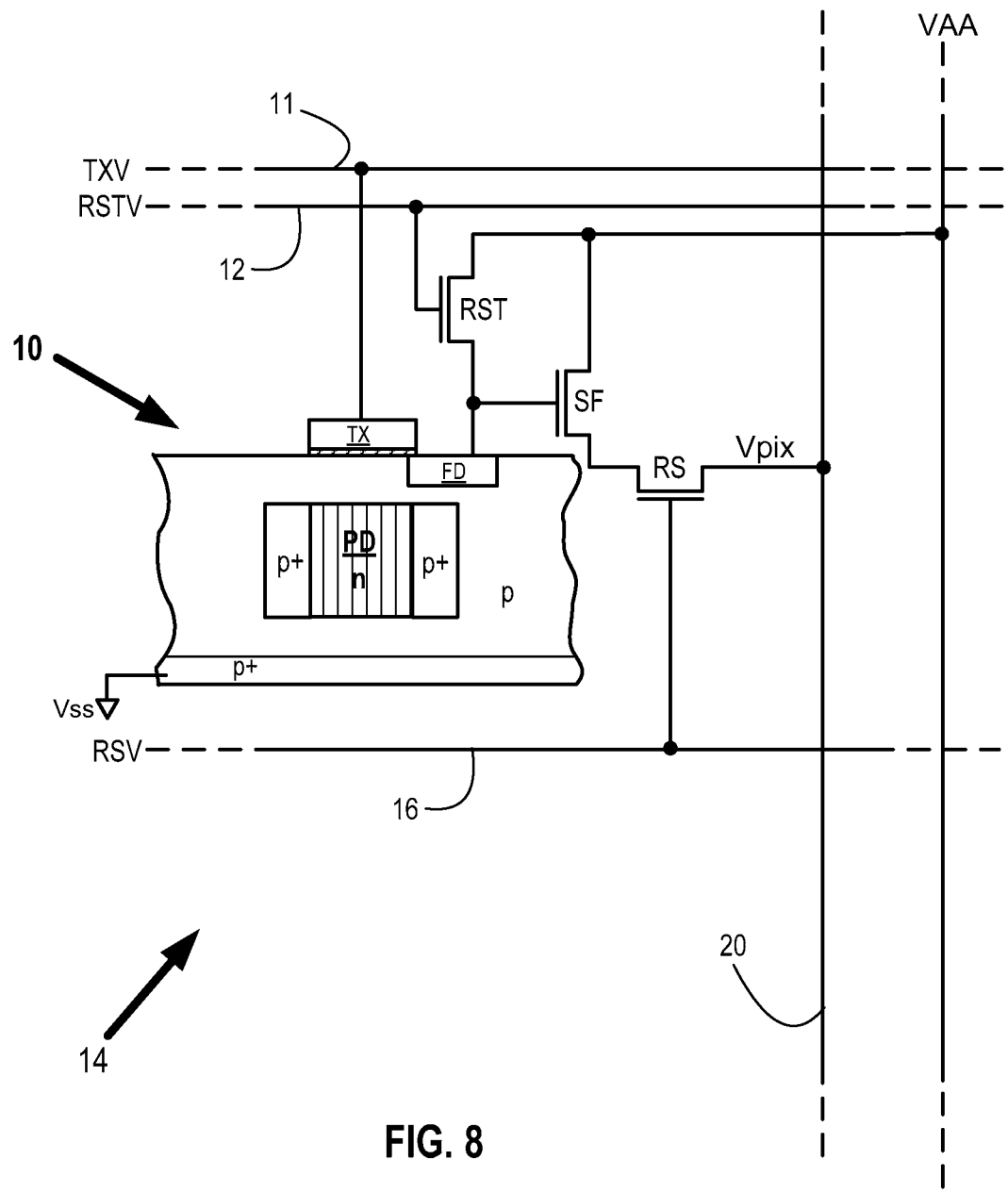
FIG. 8 schematically depicts a pixel circuit comprising a portion of a pixel such as the portion depicted in FIG. 7, in accordance with some embodiments.

FIG. 8 schematically depicts a pixel circuit 14 comprising a portion 10 such as portion 10 of FIG. 7, though the illustrative embodiment of FIG. 2 may be used instead. More specifically, simply for purposes of illustration of some illustrative variations that are possible, the portion 10 of pixel 14 in FIG. 8, while similar to portion of pixel 10 in FIG. 7, has a somewhat different layer design. Nonetheless, for purposes of the ensuing description, portion 10 of FIG. 8 functions and operates to accumulate charge in a buried-well region pD (disposed beneath a transfer gate TX) and transfer that accumulated charge to a high conversion gain floating diffusion region FD under control of transfer gate TX in accordance with the function and operation of the CMOS buried-well pixel described with reference to the foregoing figures.

In operation, a row select transistor RS is activated by row select signal RSV on line 16 and connects the imager pixel 14 to a column line 20. A reset transistor RST is typically turned on by a reset signal RSTV on line 12 and the floating diffusion region FD is reset to a predetermined voltage (eg., $V_{AA}$). Integration of backside incident photons and accumulation in PD of photo-electrons generated from the photons is conducted at least during the reset period and prior to the application of a transfer gate voltage signal TX. The transfer gate voltage signal TXV applied on line 11 to transfer gate TX is then asserted to cause the accumulated charge in the photodiode buried-well PD to transfer to the collection or floating diffusion region FD.

As illustrated, the collection or floating diffusion region FD is electrically connected to the gate of a source follower transistor SF, the output of which is selectively applied to the column line 20 by row select transistor RS as pixel voltage Vpix. The reset transistor RST selectively resets the collection or floating diffusion region FD to a predetermined voltage by coupling a voltage $V_{AA}$ to the collection or floating diffusion region FD during a reset period which precedes or follows a charge accumulation or integration period.

Figure 9:
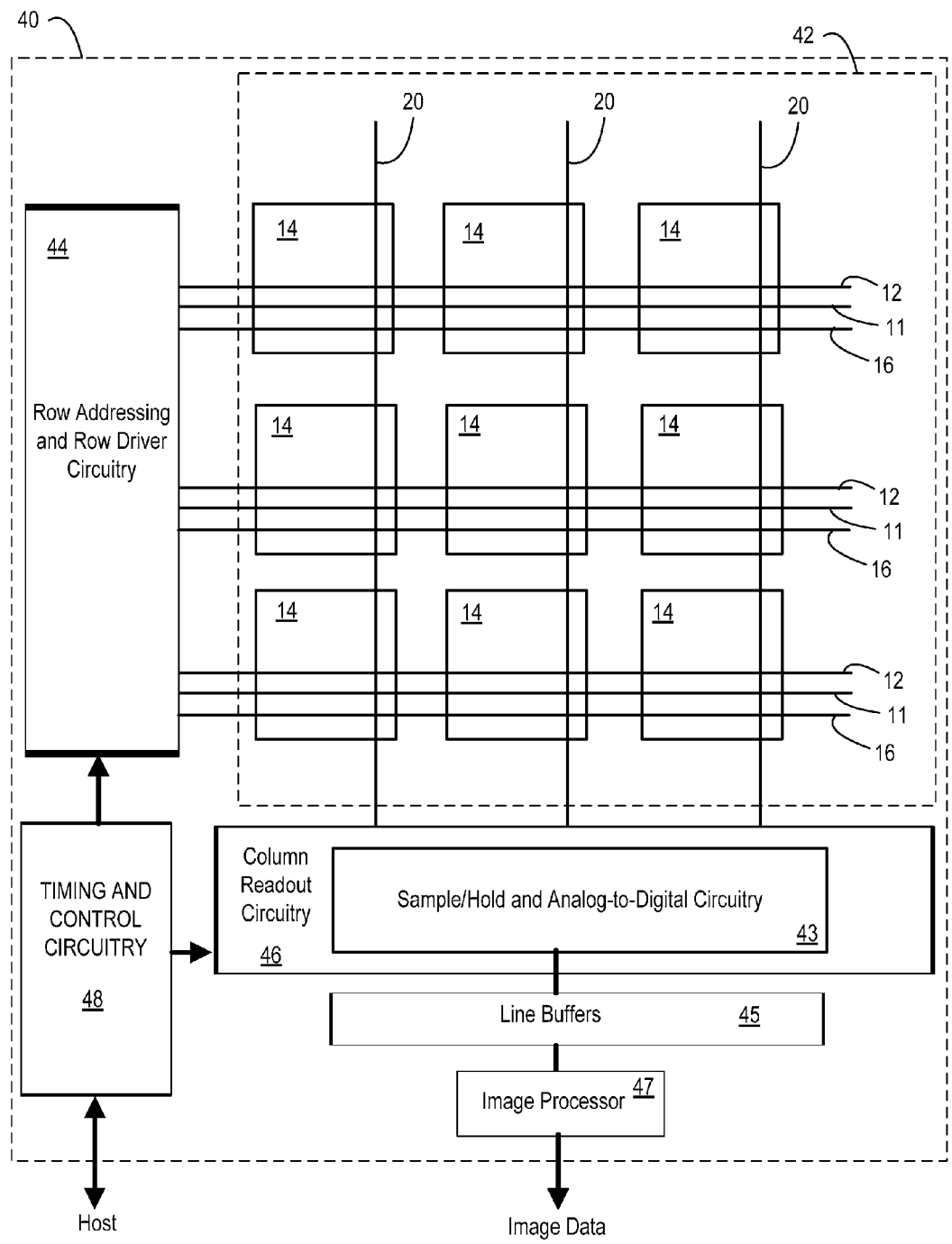
FIG. 9 depicts a block diagram of an illustrative CMOS image sensor architecture that may be used to implement embodiments in accordance with the present disclosure, in accordance with some embodiments.

FIG. 9 depicts a block diagram of an illustrative CMOS image sensor 40 architecture that may be used to implement embodiments in accordance with the present disclosure, such as embodiments of backside-illuminated high conversion gain vertically-pinned buried-well pixels in accordance with those described hereinabove in connection with FIGS. 1 and 4. As well known, pixel array 42 typically includes a large number of pixels arranged in an M×N array; however, CMOS image sensor 40 is shown as including a simplified pixel array 42 comprising a three by three array of pixels 14, which, for ease of discussion, is a 4T pixel circuit in this embodiment (e.g., as per FIG. 4), but may be any of a variety of pixel circuit types (e.g., a reset diode may be implemented instead of a reset transistor). And, in some embodiments, the pixels may be shared pixels and may further be configured for in-pixel binning Row Addressing and Row Driver Circuitry 44 generates transfer gate control signals on lines 11, row select signals on lines 16, an reset gate control signals on lines 12. Column Readout Circuitry 46 includes analog-to-digital circuitry 43 for sampling and digitizing output values readout from the pixel array 42. Particularly, circuitry 43 may be implemented to comprise a plurality of A/D converters configured to implement column-parallel readout. In some embodiments, the circuitry 43 may be configured such that the readout circuitry associated with each column bus 20 may have a respective analog-to-digital converter (ADC), though in some embodiments pairs of columns may share an ADC.

Timing and control circuitry 48 controls both the row addressing and row driver circuitry 44 and the column readout circuitry 43. For instance, timing and control circuitry controls the row addressing and row driver circuitry 44 for selecting the appropriate row for readout, and may, for example, provide timing control signals in accordance with rolling shutter readout or global shutter readout. As indicated in FIG. 5, timing and control circuitry 48 may also communicably interface with a host (e.g., a processor associated with a system comprising the image sensor), which may, for example, in some implementations, specify various control information.

As schematically depicted, signals on column buses 20 are sampled and digitized by circuitry 43, and the digitized pixel values provided by the ADCs may be provided to line buffers 45, which may be used to temporarily store digital signals from circuitry 43 for use by image processor 47. In general, any number of line buffers 45 may be included and, for example, each line buffer may be capable of storing digital signals representative of the charge signals that may be read from each pixel in a given row of pixels in the pixel array 42. Image processor 47 may be used to process the digital signals held in line buffers 36 to produce output image data that may be provided to a device external to the image sensor 40.

As may be appreciated, there are many possible alternative implementations of an image sensor architecture that may embody low full-well capacity, high conversion gain buried-well CMOS pixels in accordance with some embodiments of the present disclosure. By way of example, it will be understood that circuitry 46 may be divided into two portions provided at the top and bottom of the pixels array.

Figure 10:
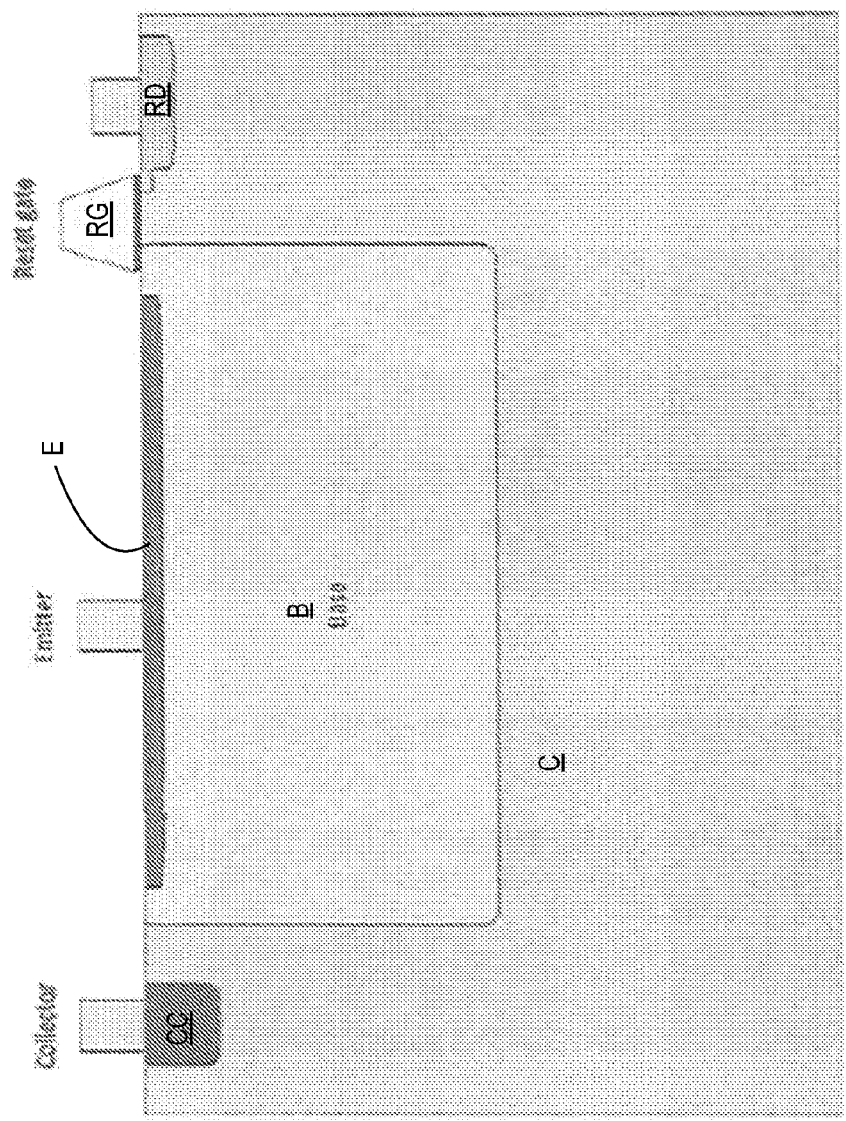
FIG. 10 is a schematic diagram of an exemplary bipolar pixel (e.g., jot), showing the extended emitter and the reset transistor, in accordance with some embodiments.

Referring now to FIG. 10, shown is a portion of an illustrative bipolar transistor pixel 10 configured for low-full well capacity and high sensitivity, in accordance with some embodiments of the present disclosure. As understood by those skilled in the art, the general structure of the bipolar pixel (e.g., jot) is similar to that of a vertical bipolar transistor, with the addition of a reset transistor coupled to the base. The working principle of the device, as further described below, is the same regardless of whether a p-n-p or n-p-n polarity is chosen, if accompanied by the appropriate sign changes. Without loss of generality, and for clarity of exposition, the bipolar transistor pixel device shall be assumed to be p-n-p for the purposes of the present discussion of an illustrative embodiment. In other words, for purposes of illustration, bipolar pixel 10 may be considered as comprising an p-type emitter E, an n-type base B, and a p-type collector C. As such, collector contact region CC is heavily doped p-type (p+), and reset drain RD is heavily doped n-type (n+).

As will be further understood in view of the ensuing description, the bipolar pixel is configured to provide for the base being fully depleted and used to store photocarrier(s) (e.g., photoelectrons in the illustrative p-n-p structure; photoholes in an n-p-n implementation). As will also be understood, in some respects, the bipolar jot configuration, in general terms and in some respects, may be considered as being similar to a phototransistor operating in punchthrough, and further including a reset transistor coupled to the base, with the emitter/base configured to ensure the base is fully depleted. And, in some respects, the bipolar jot configuration may be considered as resembling a static induction transistor. Further, as noted, the illustrative embodiment is congruent with current CMOS technology; for example, the structure is similar to a CMOS APS but uses the pinning layer as the emitter, and the storage well as the base. As will be understood in view of the present disclosure, with the appropriate doping profiles and doping levels, very high gains and sensitivity can be achieved by implementing a bipolar pixel (e.g., jot) in accordance with some embodiments of the present invention.

A method to reset the base is an important aspect according to some embodiments. As noted, the base B is coupled to at least one (and possibly a plurality of) reset transistors. To ensure that the base is completely empty (e.g., fully depleted of mobile carriers), use of the pinning concept may also be employed according to some embodiments. For example, in some embodiments, such as that depicted in FIG. 10, the emitter may be configured to extend to cover most of the base and act as a pinning layer to help ensure full-well depletion of the base. The full-well depletion is important because ensuring that the base is devoid of any free charge carrier after reset reduces and/or eliminates temporal noise and lag. The extended emitter also helps to minimize the reset noise and dark current generation from the surface states. Such an action effectively passivates the surface states, reducing the dark current noise in the device.

The bipolar jot is the first to integrate the pinning effect that is used in CMOS active pixels and the high gain of the bipolar transistor to achieve a high gain low noise solid state imaging device for use in binary imaging system. Other solid state imaging devices like the avalanche photodiode are capable of providing the required gain, however they tend to require higher voltage and have large dead times. These are problems that do not exist in the bipolar pixel (e.g., jot). Jots are capable of being integrated into a scanned readout system unlike SPADS that are typically event driven. This allows jot to operate so much faster and the supporting electronics tend to be less complex.

In operation, photogenerated charge (e.g., photoelectrons in the p-n-p embodiment; photoholes in n-p-n embodiments) will accumulate in the base (e.g., because that charge cannot overcome the potential barrier presented by the emitter-base junction), thus resulting in a decrease in the base potential (e.g., relative to the collector voltage).

Figure 13:
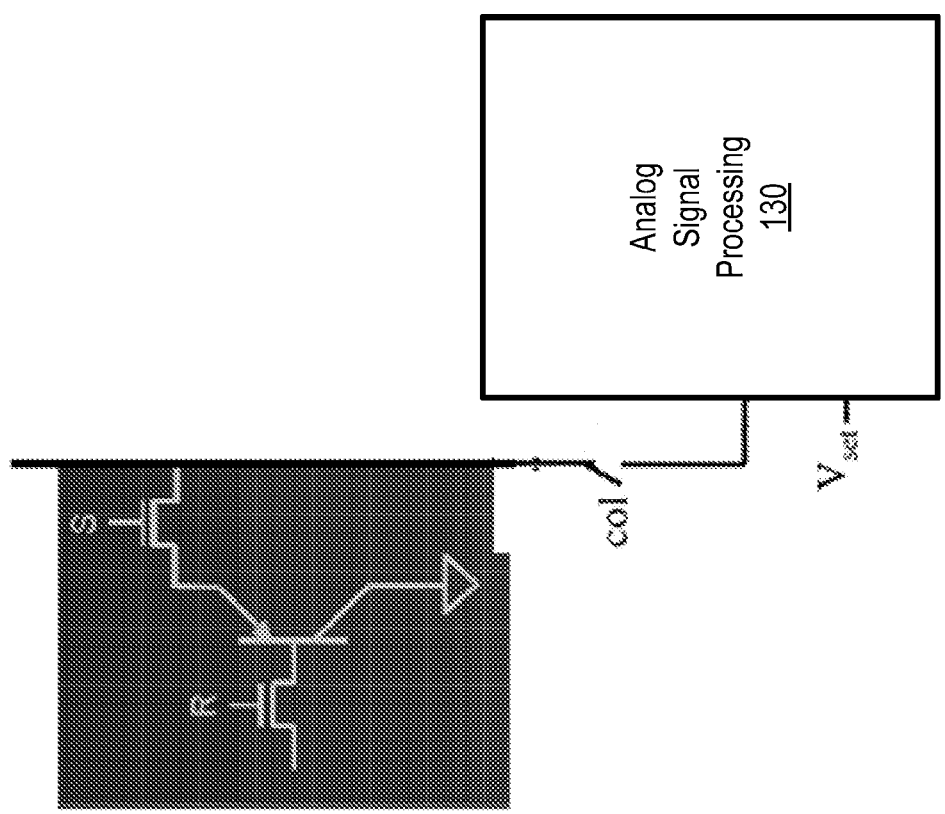
FIG. 13 depicts a bipolar pixel coupled to analog readout circuitry that provides a constant emitter-collector voltage, in accordance with some embodiments.

After the integration time, a current may be passed through the pixel (e.g., jot) from the emitter to the collector to readout the pixel. At a fixed emitter-collector voltage, the charge density in the base and thus generated charges can be determined according to the current flowing through. That is, since the emitter-base voltage is reduced by the stored charge, minority carrier injection into the base is increased for a given emitter-collector voltage (compared to when no charge is stored in the base), and the collector current measured at a fixed emitter-collector voltage will thus, generally, monotonically increase according to greater stored charge. An illustrative pixel circuit (comprising the bipolar pixel device having a reset transistor with reset gate R coupled to its base, and having its emitter selectively coupled to column bus via a select transistor with gate S) configured for fixed emitter-collector voltage readout of the current using analog signal processing circuit 130 is schematically illustrated in FIG. 13 by way of non-limiting example, according to some embodiments.

Figure 14:
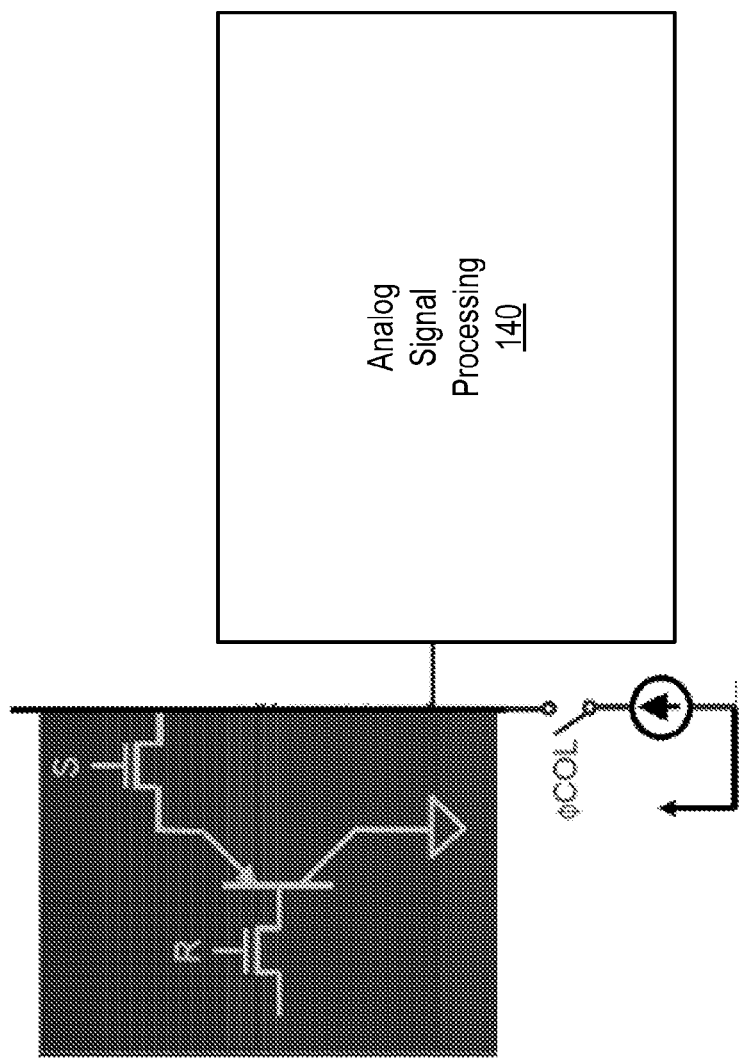
FIG. 14 depicts a bipolar pixel coupled to analog readout circuitry that provides a constant readout current, in accordance with some embodiments.

Likewise, if in reading out the pixel the current is held constant, the amount of generated charge can be estimated from the emitter-collector voltage. An illustrative pixel circuit configured for fixed current readout of the emitter-collector voltage using analog signal processing circuitry 140 is illustrated in FIG. 14 by way of non-limiting example, according to some embodiments.

Figure 11:
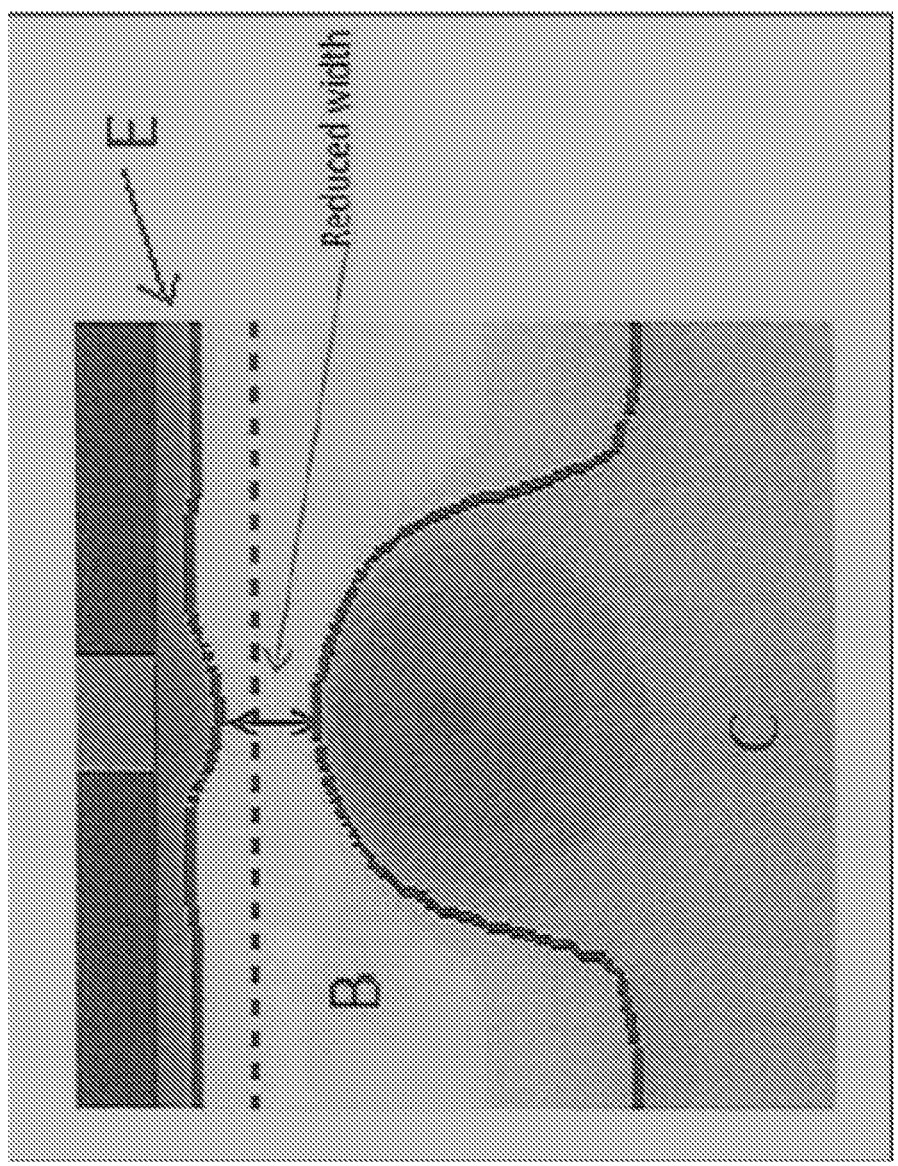
FIG. 11 is a simulation plot showing a section of a bipolar pixel, showing the region of the base that has been reduced to increase current flow, in accordance with some embodiments.

In accordance with some embodiments, the performance of the jot can be improved with specialized processing. Two examples of these enhancements include base-channel-width-modulation (BCWM) and potential-barrier-modulation (PBM). In both schemes, the width of a part of the base is intentionally designed to be thinner than the rest of the base to provide a shorter path for current from the collector to the emitter at that location, as depicted in FIG. 11 corresponding to a plot of the net active charge distribution determined according to a TCAD simulation.

Figure 12:
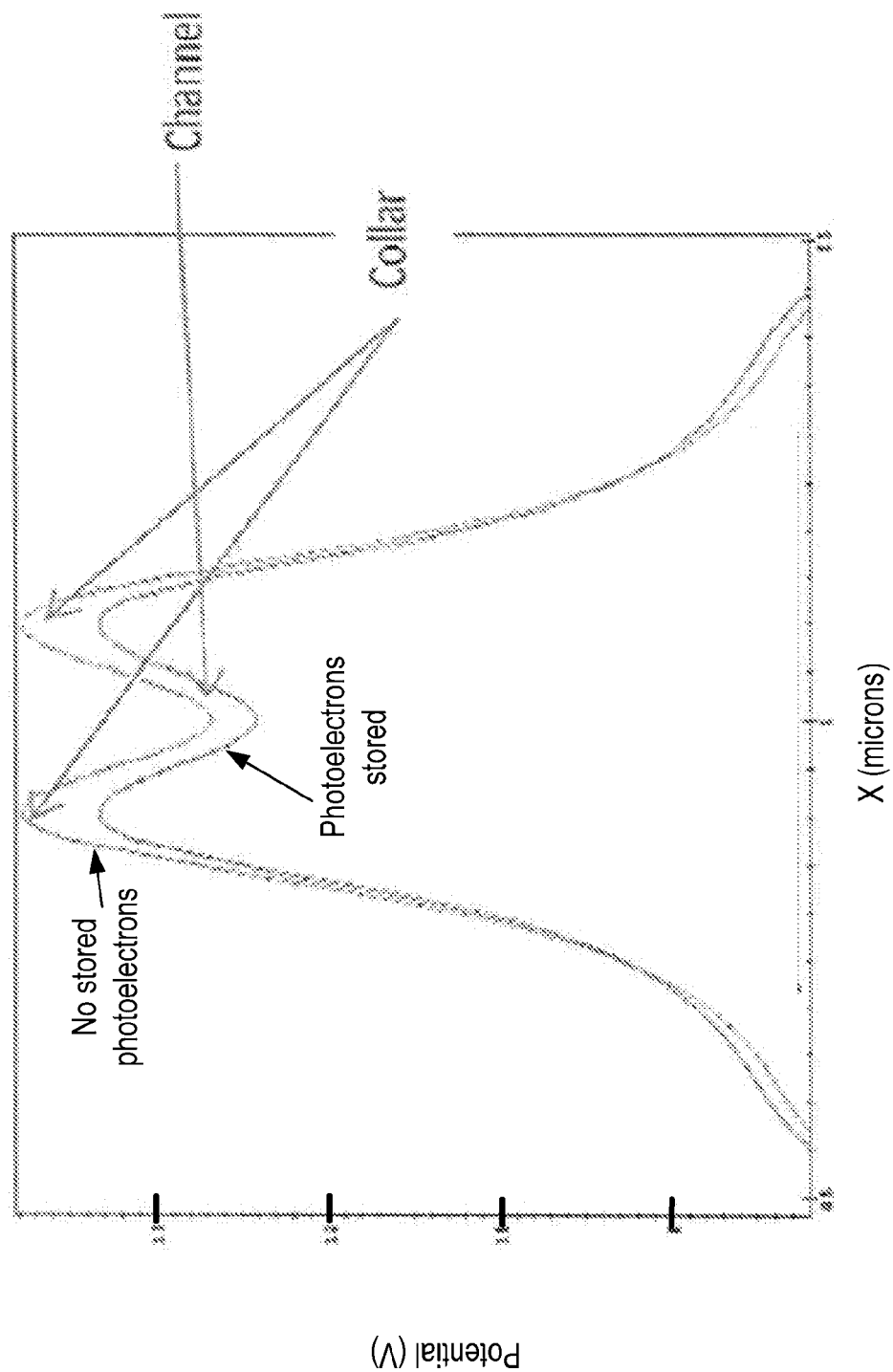
FIG. 12 is a diagram showing the potential along the dotted line in FIG. 11, showing the channel through the base and the potential collar around it in two dimensions (2D), in accordance with some embodiments.

In the BCWM method, this path, or channel, is encircled by a region of high potential referred to as the potential collar. This potential collar has the highest potential in the device, and as a result, generated photoelectrons accumulate in this collar. As the electron density increases, the potential in the collar is reduced, effectively widening the channel. The widening of the channel must be accompanied by either a change in the emitter current or an emitter voltage. Simulation results for the BCWM method are depicted in FIG. 12, which is a diagram showing the potential along the dotted line in FIG. 11, showing the channel through the base and the potential collar around it in two dimensions (2D), for the case of no stored photoelectrons in the collar and the case of stored photoelectrons in the collar, in accordance with some embodiments.

In the PBM scheme a high potential low capacitance pocket is placed in the middle of the channel (e.g., by providing a pocket of increased n-type doping in the n-type base), acting as a higher potential barrier to the emitter current. As the generated photoelectrons accumulate in this pocket, the potential falls. This is equivalent to a lowering of the potential barrier, and like in the case of the BCWM, the potential change must be accompanied by a change in emitter current or potential, depending on the operating scheme chosen.

In some embodiments, in accordance with the foregoing discussion, an operating sequence may be implemented as follows. The base is reset to clear out all carriers. Photocarriers are then integrated in the base, changing its potential barrier relative to the collector. For readout, the emitter current is sensed in an emitter-follower configuration (e.g., such as may be implemente in FIG. 14) although other configurations may be used as is well known to those skilled in the art of bipolar analog integrated circuit design. The emitter-follower configuration reduces the effective capacitance between base and emitter, thereby increasing the input-referred conversion gain of the readout circuit. The signal is sensed by the readout circuit of the image sensor. The base is then reset to clear out all carriers. The reset level of the pixel is then sensed by the readout circuit. The difference between the two levels is used to suppress temporal and fixed pattern noise (i.e., CDS may be employed).

Accordingly, a bipolar pixel structure according to some embodiments of the present disclosure modulates current through the device according to the quantity of free carriers (e.g., photocarriers) stored in the base (e.g., current is modulated according to the complete absence of free carriers in the base, or by a limited number of carriers in the base (e.g., 1 to 1000), and the complete reset of the base allows for coorrelated double sampling (CDS) and thus the suppression of kTC reset noise.

It will be apparent to those skilled in the art that various modifications and variations can be made to the bipolar structure according to various embodiments. For example, for improved isolation, a trench isolation structure, well known to those skilled in the art of semiconductor device fabrication, can be used between pixels. Alternatively or additionally, the reset gate could be formed in a trench to allow improved access to the base region. Further, the bipolar pixel structure may be combined with microlenses, optical coatings, and color filters to improve optical response and color separation, as is well known to those skilled in the art of frontside and backside illuminated image sensors.

An exemplary description of a bipolar junction transistor image sensor technology jot implementation is included in the June 2013 paper presented at the 2013 International Image Sensor Workshop (IISW), Snowbird, Utah, entitled "Early Research Progress on Quanta Image Sensors," by Saleh Masoodian, Yue Song. Donald Hondongwa, Jiaju Ma, Kofi Odame and Eric R. Fossum, the disclosure of which is incorporated by reference herein and is considered to be part of the present disclosure.

The present invention has been illustrated and described with respect to some specific embodiments thereof, which embodiments are merely illustrative of some of the principles of some embodiments of the invention and are not intended to be exclusive or otherwise limiting embodiments. Accordingly, although the above description of illustrative embodiments of the present invention, as well as various illustrative modifications and features thereof, provides many specificities, these enabling details should not be construed as limiting the scope of the invention, and it will be readily understood by those persons skilled in the art that the present invention is susceptible to many modifications, adaptations, variations, omissions, additions, and equivalent implementations without departing from this scope and without diminishing its attendant advantages. For instance, except to the extent necessary or inherent in the processes themselves, no particular order to steps or stages of methods or processes described in this disclosure, including the figures, is implied. In many cases the order of process steps may be varied, and various illustrative steps may be combined, altered, or omitted, without changing the purpose, effect or import of the methods described. Similarly, the structure and/or function of a component may be combined into a single component or divided among two or more components. It is further noted that the terms and expressions have been used as terms of description and not terms of limitation. There is no intention to use the terms or expressions to exclude any equivalents of features shown and described or portions thereof. Additionally, the present invention may be practiced without necessarily providing one or more of the advantages described herein or otherwise understood in view of the disclosure and/or that may be realized in some embodiments thereof. It is therefore intended that the present invention is not limited to the disclosed embodiments but should be defined in accordance with claims that are based on the present disclosure, as such claims may be presented herein and/or in any patent applications claiming priority to, based on, and/or corresponding to the present disclosure.

What is claimed is:

1. An image sensor comprising a plurality of pixels, each pixel comprising:
   a transfer gate formed on a first surface of a semiconductor substrate;
   a floating diffusion region formed in the first surface of the semiconductor substrate; and
   a buried-well vertically-pinned photodiode having (i) a charge accumulation/storage region disposed substantially or entirely beneath the transfer gate and spaced away from the first surface of the semiconductor substrate, and (ii) a pinning region spaced away from the first surface of the semiconductor substrate and disposed laterally to the charge accumulation/storage region and configured to pin the potential of the charge accumulation/storage region, wherein the charge accumulation/storage region has a full-well capacity less than 3000 charge carriers, and substantially all photocharge generated by the photodiode in response to impinging photons is accumulated in the charge accumulation/storage region beneath the transfer gate; and
   wherein a potential barrier prevents charge transfer between the charge accumulation/storage region and the floating diffusion when a first voltage is applied to the transfer gate, and the potential barrier is reduced or eliminated so as to allow charge transfer between the charge accumulation/storage region and the floating diffusion when a second voltage is applied to the transfer gate, such that the transfer gate is operable to selectively transfer charge from the charge accumulation/storage region to the floating diffusion.

2. The image sensor according to claim 1, wherein the buried-well photodiode does not include a pinning layer disposed at the first surface of the semiconductor substrate, and the pinning region causes the charge accumulation/storage region to be fully depleted of free charge carriers after any photocarriers are transferred to the floating diffusion.

3. The image sensor according to claim 1, wherein the image sensor is configured as a digital integration sensor (DIS).

4. The image sensor according to claim 1, wherein the image sensor is configured as a backside-illuminated device.

5. The image sensor according to claim 1, wherein a plurality of neighboring pixels have a common color filter and/or microlens.

6. An image sensor according to claim 1, wherein respective pluralities of the pixels are configured to share respective floating diffusions, such that each floating diffusion is shared between two or more adjacent pixels.

7. The image sensor according to claim 6, wherein charge signals from two or more adjacent pixels are summed prior to readout.

8. The image sensor according to claim 1, wherein the second voltage applied to the transfer gate causes the accumulation of holes under the transfer gate, wherein the transfer gate comprises an n-channel MOS transistor device.

9. The image sensor according to claim 1, wherein the image sensor is a single-bit or multi-bit photoelectron counting image sensor.

10. The image sensor according to claim 1, wherein no potential barrier exists between the charge accumulation/storage region and the floating diffusion when the second voltage is applied to the transfer gate.

11. The image sensor according to claim 1, wherein the charge accumulation/storage region has a full-well capacity not more than 2048 charge carriers.

12. A CMOS active pixel image sensor comprising an array of pixels formed on or in a semiconductor substrate, each pixel configured for selective intra-pixel charge transfer from a respective charge storage node that is primarily located under a transfer gate of the pixel, wherein the transfer gate is disposed on a first surface of the semiconductor substrate and is operable to transfer charge from the charge storage node to a floating diffusion, wherein the charge storage node has a full-well capacity less than 3000 charge carriers and has a potential that is pinned by a buried pinning region that is spaced away from the first surface of the semiconductor substrate, and wherein each pixel does not include a pinning layer disposed at the first surface of the semiconductor substrate.

13. The CMOS active pixel image sensor according to claim 12, wherein the charge storage node is contained in a buried-well photodiode comprising the buried pinning region that causes the charge storage node to be fully depleted of free charge carriers after any photocarriers are transferred from the charge storage node to the floating diffusion.

14. The CMOS active pixel image sensor according to claim 12, wherein the image sensor is configured as a digital integration sensor (DIS).

15. The CMOS active pixel image sensor according to claim 12, wherein the CMOS active pixel image sensor is configured as a backside-illuminated device.

16. The CMOS active pixel image sensor according to claim 12, wherein a plurality of neighboring pixels have a common color filter and/or microlens.

17. The CMOS active pixel image sensor according to according to claim 12, wherein respective pluralities of the pixels are configured to share respective floating diffusions, such that each floating diffusion is shared between two or more adjacent pixels.

18. The image sensor according to claim 17, wherein charge signals from two or more adjacent pixels are summed prior to readout.

19. The image sensor according to claim 12, wherein application of a second voltage to the transfer gate causes charge transfer from the charge storage node to the floating diffusion and causes the accumulation of holes under the transfer gate, wherein the transfer gate comprises an n-channel MOS transistor device.

20. The image sensor according to claim 12, wherein the image sensor is a single-bit or multi-bit photoelectron counting image sensor.

21. The image sensor according to claim 12, wherein the charge storage node has a full-well capacity not more than 1024 charge carriers.

* * * * *